United States Patent [19]

Swetman

[11] Patent Number: 4,992,668
[45] Date of Patent: Feb. 12, 1991

[54] ELECTRON BEAM PATTERN GENERATOR CONTROL

[75] Inventor: John P. Swetman, Horsham, England

[73] Assignee: U.S. Philips Corporation, New York, N.Y.

[21] Appl. No.: 48,195

[22] Filed: May 11, 1987

[30] Foreign Application Priority Data

May 16, 1986 [GB] United Kingdom ................ 8612009

[51] Int. Cl.$^5$ ............................................. H01J 37/30
[52] U.S. Cl. .................................. 250/492.3; 250/398
[58] Field of Search .............. 250/492.22, 398, 492.23

[56] References Cited

U.S. PATENT DOCUMENTS

| 3,956,635 | 5/1976 | Chang | 250/492.23 |
|---|---|---|---|
| 4,151,422 | 4/1979 | Goto et al. | 250/492 |
| 4,199,689 | 4/1980 | Takigawa | 250/452.23 |
| 4,280,186 | 7/1981 | Hidao et al. | 250/452.22 |
| 4,445,039 | 4/1984 | Yew | 250/492.22 |
| 4,477,729 | 10/1984 | Chang | 250/492.22 |
| 4,530,064 | 7/1985 | Takigawa et al. | 200/452.22 |

FOREIGN PATENT DOCUMENTS

| 0012675 | 1/1979 | Japan | 250/492.22 |
|---|---|---|---|
| 0071133 | 5/1982 | Japan | 250/492.22 |
| 0071134 | 5/1982 | Japan | 250/492.22 |

*Primary Examiner*—Bruce C. Anderson
*Attorney, Agent, or Firm*—Robert T. Mayer

[57] ABSTRACT

A method is provided for controlling an electron beam pattern generator which writes a pattern on a substrate with an electron beam. A pattern store holds the defining coordinates of a set of trapezia 9, 13, 14, 15, 16 which together constitute the pattern. The set of trapezia in the store are divided into groups written in turn on the substrate, successive groups containing successively coarser 13, 14, 15, 16 to finer 9 pattern details. The groups are preceded in the pattern store by respective data words which instruct a trapezium generator to produce scanning steps of successive groups at successively higher to lower frequencies respectively. Coarse detail is thereby written quickly and fine detail receives the correct electron exposure.

4 Claims, 1 Drawing Sheet

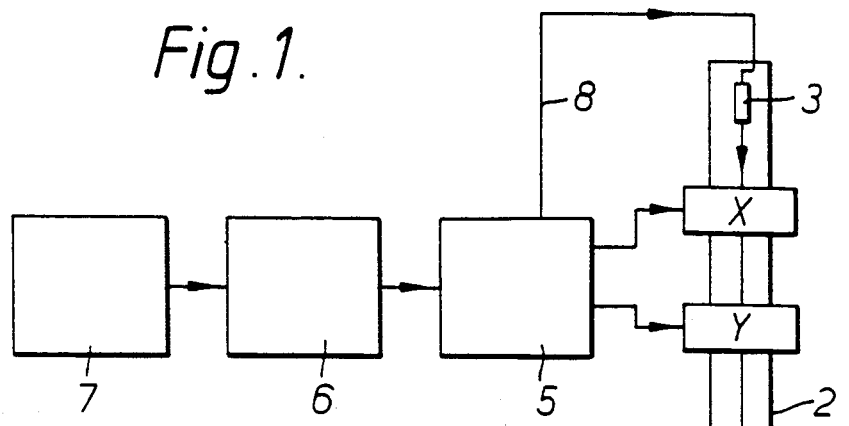
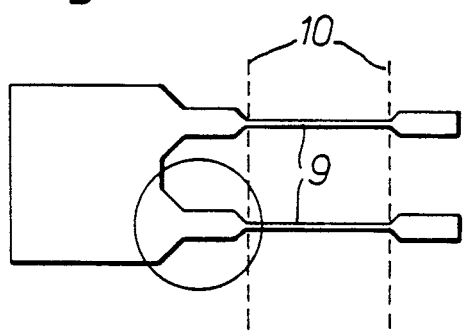
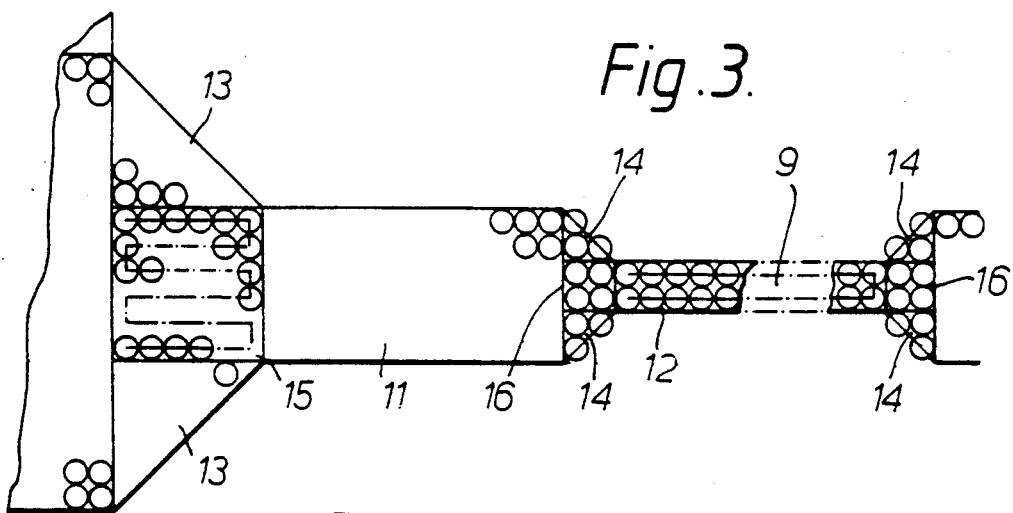
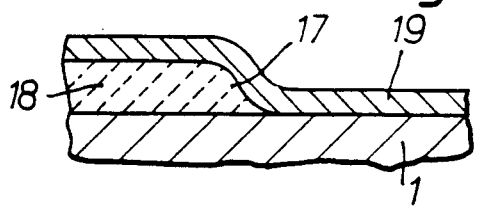
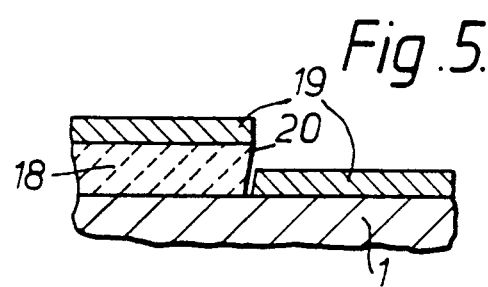

ELECTRON BEAM PATTERN GENERATOR CONTROL

This invention relates to a method of controlling an electron beam pattern generator comprising an electron beam generation and deflection system for writing a pattern on a substrate with a spot formed by an electron beam, a pattern store for holding the defining coordinates of a set of trapezia which together constitute the pattern, and a trapezium generator for taking the defining coordinates of each trapezium in turn and for generating scanning steps for the electron beam deflection system to write each trapezium in turn on the substrate.

An important application of electron beam technology is in the manufacture of semiconductor devices. In particular, a so-called electron beam pattern generator can be used to direct an electron beam towards a target in the form of a semiconductor substrate coated with an electron sensitive resist. By computer control of the beam a predetermined pattern can be drawn in the resist. The exposed parts, or in the case of a negative resist the unexposed parts, of the resist are then removed selectively using an appropriate chemical. The remaining parts of the resist form a masking layer on the surface of the semiconductor substrate which can be used subsequently in the processing of the semiconductor wafer, for example to mask a metalisation layer.

Such an electron beam pattern generator and its control arrangements are described in the article "An Electron Beam Maskmaker" by J. P. Beasley and D. G. Squire in IEEE Transactions on Electron Devices, Vol ED-22, No. 7, July 1975. Therein it is described how the pattern can be written as the summation of a large number of small rectangles, each of which is written by moving the electron beam in a succession of small steps in a spiral pattern to fill in the rectangle. Triangles, or trapezia in general, may be written by this method.

It is desired to use such an electron beam pattern generator as a production machine. There is therefore a strong incentive to increase the writing speed of the beam to improve production throughput. The adoption of the rectangle writing method, now referred to in the art as vectorscanning, provides an improvement in writing speed over simple raster scanning with beam modulation since time is not wasted traversing the beam across areas of substrate which are devoid of pattern.

It is a further requirement of electron beam pattern generators that they shall be capable of writing patterns which contain submicron detail as well as large area detail, for example, connection pads. Such submicron detail may comprise fine lines which may be only a few spot diameters in width. In this event the problem of adequate exposure for these fine lines arises. Usually, the beam current will have been chosen to provide adequate exposure for the large area detail and it is not desirable to increase the current for the fine detail since this will involve an enlargement of spot size and other undesirable changes in operating conditions of the electron beam column. The electron dose, given by the dwell time of the spot at each step, which is required to define a pattern is dependent upon the geometry and area of the pattern details. For example a 0.25 $\mu$m wide pattern requires some four times the dose used to define large area detail.

It is an object of the invention to maximise writing speed and at the same time to provide correctly exposed fine detail.

The invention provides a method of controlling an electron beam pattern generator comprising an electron beam generation and deflection system for writing a pattern on a substrate with a spot formed by an electron beam, a pattern store for holding the defining coordinatees of a set of trapezia which together constitute the pattern, and a trapezium generator for taking the defining coordinates of each trapezium in turn and for generating scanning steps for the electron beam deflection system to write each trapezium in turn on the substrate, the method being characterised in that the set of trapezia in the pattern store are divided into groups which are written in turn on the substrate, successive groups comprising those trapezia which define successively coarser to finer pattern details, and in that the groups are each preceded in the pattern store by respective data words which instruct the trapezium generator to generate the scanning steps of the successive groups at successively higher to lower frequencies respectively. In many patterns used in semiconductor integrated circuits only a small fraction of the pattern is of very fine detail. Consequently in many cases only two groups of trapezia are needed, the trapezia in one group being written before the trapezia of the other group.

As has been mentioned previously, a common subsequent stage in processing the wafer is to apply a metallization layer by evaporation to the whole substrate after dissolving away the exposed resist. After this metallization, a second solvent is used to dissolve away the resist under the metallization, taking that part of metallization away and leaving only that part of the metal layer which was deposited directly on the substrate and is required to form an interconnection pattern. If this removal of metal on top of resist is to occur, the second solvent must be able to attack the resist at its edges under the metal. If, as a result of over exposure, the resist edge is poorly defined as a sloping surface the metallization can effectively seal in the resist and render subsequent removal of metal difficult. It is a benefit of the invention that the method of writing trapezia achieves a more nearly constant and correct resist exposure per unit area in all areas, either of coarse or fine detail. This results in more sharply defined resist edges after the action of the first solvent and so greatly reduces the risk of resist "seal-in" at the metallization stage.

An embodiment of the invention will now be described, by way of example, with reference to the accompanying drawings, in which, FIG. 1 shows an electron beam pattern generator in schematic form, FIG. 2 shows a typical semiconductor substrate pattern, FIG. 3 shows a portion of FIG. 2 enlarged, FIG. 4 shows an overexposed resist edge after metallization, and FIG. 5 shows a correctly exposed resist edge after metallization.

Referring to FIG. 1, a semiconductor substrate 1 is shown in the target area of an evacuated electron beam column 2. An electron gun 3 provides an electron beam 4 which is focused as a spot on the substrate by focusing electron optics not shown. Typically the spot will have a gaussian distribution of intensity and will have a diameter of 0.12 to 0.1 $\mu$m measured at the half intensity points. Deflection coils X and Y are provided for deflecting the electron in two dimensions across the substrate. A trapezium generator 5 is provided to receive the defining coordinates of a trapezium and to output deflection currents for the X and Y coils having values which change in steps at a defined stepping rate by amounts corresponding to typically 0.10 μm on the substrate in a sequence which exposes the whole area of the trapezium. A trapezium coordinate store 6 is provided to hold the coordinates of a sub-set of trapezia for immediate access by the trapezium generator. The full set of trapezia are held in a pattern store 7, typically a magnetic disc store, and loaded in sub-sets into the trapezium coordinate store as required. The trapezium generator 5 is provided with a connection 8 to switch the electron gun 3 off when moving the beam from the end of one trapezium to the start of the next. The compilation and coding of the data held in the pattern store will be dealt with later.

FIG. 2 shows a portion of a typical pattern required on a semiconductor substrate, being a gate electrode structure for a field effect transistor. The gate electrode is the structure of two fine lines 9 shown between the dotted lines 10. Typically these lines will need to be 0.2 μm wide. Outside the dotted lines is coarse detail pattern comprising connection pads for the gate electrodes. FIG. 3 shows the circled portion of FIG. 2 enlarged to show details of constituent trapezia and scanning patterns. The trapezia comprise rectangles 11, 12, triangles 13, 4, and squares 15, 16. In square 15 a scanning pattern for the electron spot is shown as a sequence of spot positions shown as circles drawn at the half-intensity radius. The defining coordinate for the square could be the position of a corner and the side length, assuming the square to be orthogonal with the X and Y deflection directions. Arbitrary trapezia could be defined as the coordinates of the corners. The trapezium generator is programmed to take these defining coordinates and calculate the sequence of spot positions at, for example 0.1 μm intervals which will completely expose the whole trapezium. The pattern shown is a boustrophedon which zig zags across the area without wasted motion, as in a ploughing pattern. Other economical movement patterns such as spirals could be used. The fine detail 9 is drawn as two lines of spots.

The electron dose at each spot position is controlled by the spot dwell time at that position and hence by the spot stepping frequency. For example at a stepping frequency of 10 MHz, the dwell time at each position is about 100 ns. By reducing the stepping frequency the dwell time, and hence dose, can be increased, assuming constant electron beam current as is desirable for constant spot size. In electron lithography the electron dose required at each point in a pattern to achieve uniform resist exposure all over the pattern is dependent upon the geometry and area of the pattern details. This is due to the spot shape and to electron scatter effects which produce some exposure at points a few spot diameters from the point of spot incidence, referred to in the art as the proximity effect. For example, a 0.25 μm wide line requires some four times the dose used to define large area, or coarse, detail.

The information regarding coarse and fine pattern details comes into existence at a computer aided design (C.A.D.) stage when the designer specifies the nature of the circuit function required to a computer programmed to carry out detailed layout and electrode design. In accordance with the invention it is at this stage that the list of defining coordinates for all trapezia are divided into groups, usually two groups, one listing all coarse trapezia and the other listing all fine detail trapezia. The computer output, listing all members of both groups, will usually be on a magnetic tape.

To run the electron beam pattern generator (EBPG) the data of the groups will normally be required at a higher rate and with more immediate access than is possible with a magnetic tape. The data will usually be loaded onto a magnetic disc, reference 7 in FIG. 1, driven in response to the requirements of the EBPG. It is at this stage that a pattern data word in the disc information preceding each group is changed to indicate a percentage of a predetermined base clock or writing frequency in dependence on the group structure detail. A high percentage is selected for the coarse detail group and a low percentage for the fine detail group. Typically 10 MHz might be chosen for the coarse group and 2.5 MHz for the fine group. The base frequency might be 10 MHz, the two percentages being 100% and 25% respectively. In operation the EBPG will read the data word preceding the fine detail group and set the writing frequency accordingly. The fine detail trapezia will then be written. Then the data word preceding the coarse detail group would be read, the writing frequency set accordingly and the coarse detail trapezia written.

Without the improvement in accordance with the invention the whole pattern would have to be written at 2.5 MHz stepping frequency. Since the bulk of most patterns is coarse detail, with the invention the coarse detail is written at 10 MHz, i.e. four times faster. In general the total writing time is reduced by about 75%.

Also, without the invention, the coarse detail would be overexposed, being written at 2.5 MHz. FIG. 4 shows the effect of overexposure on the edge definition of the resist after the exposed resist has been dissolved away. The edge 17 of the resist 18 has a sloping profile. When the metallization 19 is applied, the sloping edge is covered by metal, effectively sealing the resist against the action of the next solvent chosen to dissolve the resist and hence remove the metal on top of the resist. FIG. 5 shows the resist edge 20 achieved with correct exposure. The resist edge is undercut to an extent and is exposed to the action of the next solvent, giving excellent metal lift-off.

There follows an example of a Pattern File Header which would precede a group of information on the disc store.

The RTL/2 specification of the header is
MODE FILEHEDMODE (
INT DATADSA; The address of the next sector in the file.
ARRAY (32)BYTE FILNAM The file name.
INT FDSIZE The number of sectors occupied by the file data.
ARRAY (100) INT User file header information.
HEDDAT);
HEDDAT FREQUENCY CONTROL DATA HELD IN THE FOLLOWING HEDDAT WORDS.
HEDDAT(30) The beam stepping frequency, expressed as a percentage (in units of 0.1%) of the base frequency specified to the EXPOSE process.
HEDDAT(31)-(37) The remaining 7 frequencies as a percentage in units of 0.1%.
HEDDAT(30) gives the stepping frequency for the group and HEDDAT(31) to (37) gives seven other lesser frequencies which might be required. Each HEDDAT entry is specified a four digit hexadecimal word. Thus if the stepping frequency is to be 100% of the base frequency, the hexadecimal word will be 03E8, i.e. 1000 units of 0.1%. For 40% of the base frequency the word would be 0190 i.e. 400 units of 0.1%.

I claim:

1. A method of controlling an electron beam pattern generator comprising an electron beam generation and deflection system for writing a pattern on a substrate with a spot formed by an electron beam, a pattern store for holding the defining coordinates of a set of trapezia which together constitute the pattern, and a trapezium generator for taking the defining coordinates of each trapezium in turn and for generating scanning steps for the electron beam deflection system to write each trapezium in turn on the substrate, the method being characterized in that the set of trapezia in the pattern store are divided into groups which are written in turn on the substrate, successive groups comprising those trapezia which define successively coarser to finer pattern details, and in that the groups are each preceded in the pattern store by respective data words which instruct the trapezium generator to generate the scanning steps for the successive groups at successively higher to lower frequencies respectively.

2. A method as claimed in claim 1 characterized in that there are only two groups, the trapezia in one group being written before the trapezia of the other group.

3. A method as claimed in claim 1 or claim 2, characterized in that a trapezium coordinate store is provided for holding the defining coordinates of a sub-set of trapezia obtained from the pattern store and in that the trapezium generator takes defining coordinate from the trapezium coordinate store.

4. A method as claimed in claim 3 characterized in that the electron beam pattern generator comprises a table on which the substrate is mounted, the table being displaceable so that a succession of substrate areas can be exposed to the electron beam, in that the pattern store comprises the set of trapezia for all areas to be exposed, and in that all trapezia in all areas of one group are written before the trapezia in all areas of the next group.

* * * * *